United States Patent
Lee

(10) Patent No.: US 7,093,085 B2
(45) Date of Patent: *Aug. 15, 2006

(54) DEVICE AND METHOD FOR MINIMIZING PUNCTURING-CAUSED OUTPUT DELAY

(75) Inventor: Jae-Hong Lee, Seoul (KR)

(73) Assignee: Samsung Electronics Co., Ltd., (KR)

(*) Notice: Subject to any disclaimer, the term of this patent is extended or adjusted under 35 U.S.C. 154(b) by 0 days.

This patent is subject to a terminal disclaimer.

(21) Appl. No.: 10/950,778

(22) Filed: Sep. 27, 2004

(65) Prior Publication Data

US 2005/0039106 A1 Feb. 17, 2005

Related U.S. Application Data

(63) Continuation of application No. 10/004,707, filed on Dec. 3, 2001, now Pat. No. 6,871,270.

(51) Int. Cl.
G06F 12/00 (2006.01)

(52) U.S. Cl. .................. 711/157; 711/214; 711/217; 711/218; 365/230.03; 365/230.04

(58) Field of Classification Search ............... 711/157, 711/214, 217, 218; 714/702, 743, 756; 365/230.03, 365/230.04
See application file for complete search history.

(56) References Cited

U.S. PATENT DOCUMENTS

| | | | |
|---|---|---|---|
| 5,636,224 A | 6/1997 | Voith et al. | |
| 5,765,218 A | 6/1998 | Ozawa et al. | |
| 6,304,612 B1* | 10/2001 | Baggen et al. | 375/262 |
| 6,339,834 B1 | 1/2002 | Crozier et al. | |
| 6,543,025 B1* | 4/2003 | Hekstra | 714/774 |
| 6,549,998 B1 | 4/2003 | Pekarich et al. | |
| 6,591,381 B1 | 7/2003 | Kim et al. | |
| 6,668,350 B1 | 12/2003 | Kim | |
| 2002/0022468 A1* | 2/2002 | Yoon et al. | 455/403 |
| 2002/0085659 A1* | 7/2002 | Kim et al. | 375/377 |
| 2003/0028843 A1 | 2/2003 | Chang et al. | |

FOREIGN PATENT DOCUMENTS

JP 2001-196941 7/2001

\* cited by examiner

*Primary Examiner*—Christian P. Chace
(74) *Attorney, Agent, or Firm*—Dilworth & Barrese LLP

(57) ABSTRACT

Disclosed is a device and method such that data of size S is stored in a memory of size K, a two-dimensional matrix with R rows and C columns, and interleaving indexes I are generated according to a predetermined interleaving rule to randomly output the data from the memory. If a first index I is greater than data size S, a second index is generated and output prior to outputting invalid data stored in the memory at the location of the first index.

1 Claim, 3 Drawing Sheets

[Fig. 1]
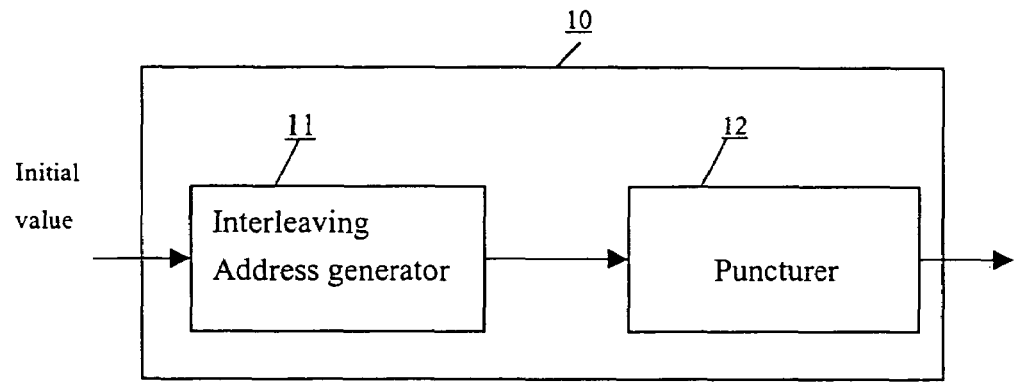
[Fig. 2]
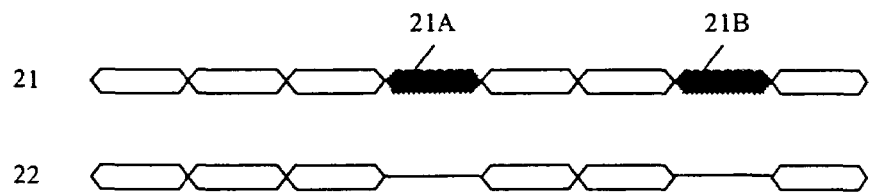
[Fig. 3]
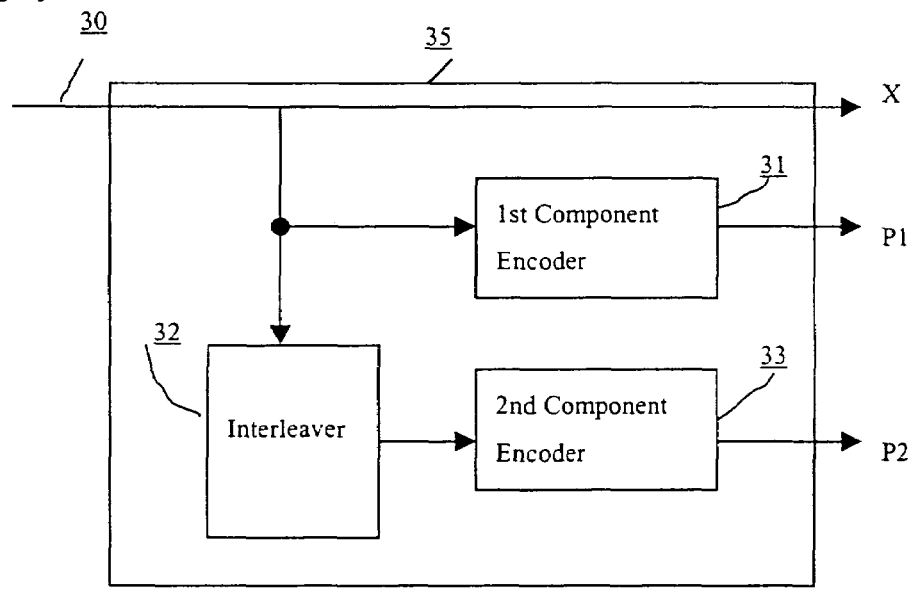

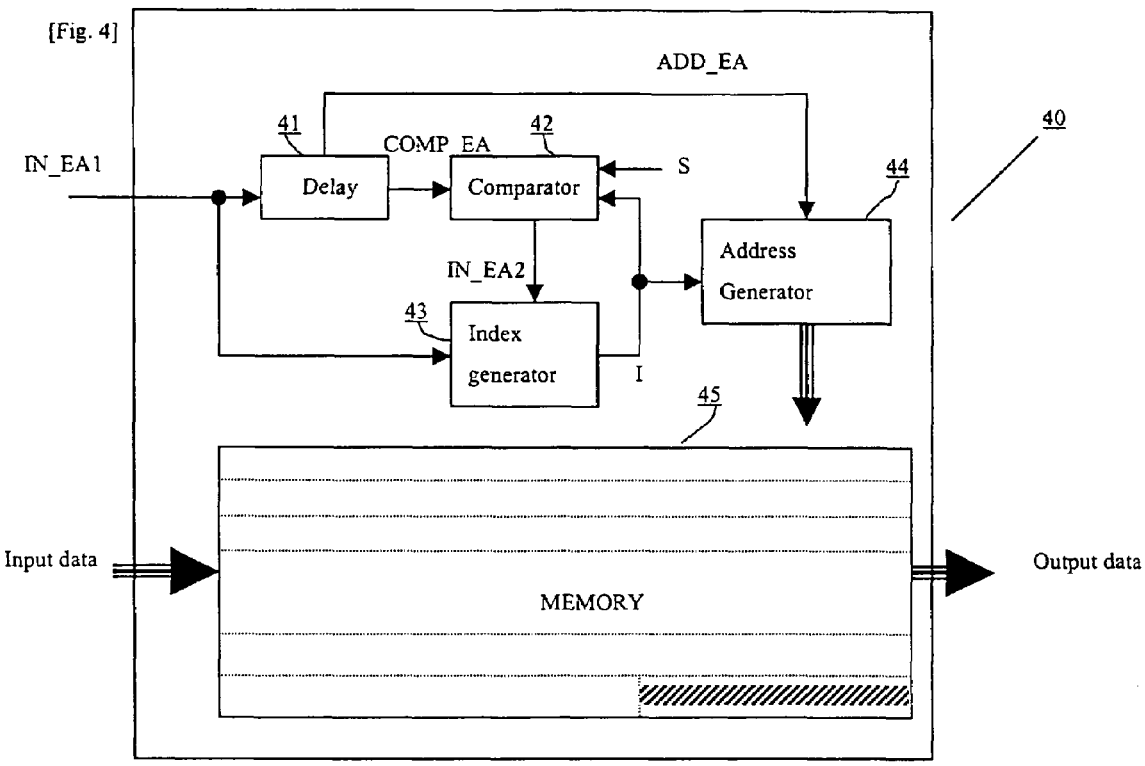
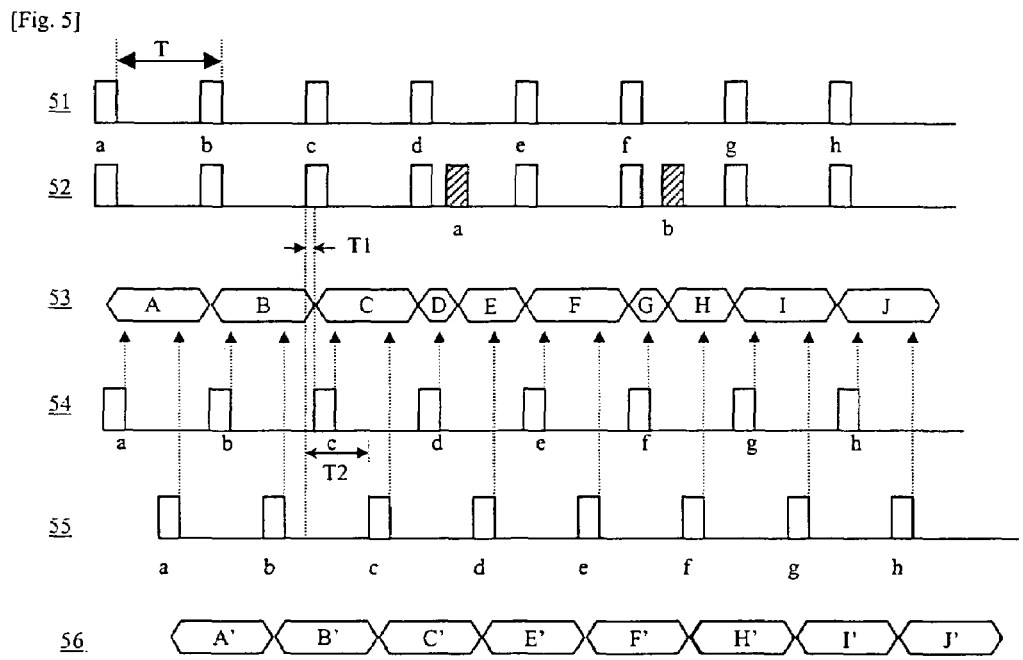

DEVICE AND METHOD FOR MINIMIZING PUNCTURING-CAUSED OUTPUT DELAY

PRIORITY

This application is a continuation of application Ser. No. 10/004,707, filed on Dec. 3, 2001 now U.S. Pat. No. 6,871,270, the contents of which are hereby incorporated by reference.

BACKGROUND OF THE INVENTION

1. Field of the Invention

The present invention relates generally to digital communications technology applied to a transmitter/receiver in a base station and a transmitter/receiver in a mobile station having a turbo encoder. In particular, the present invention relates to a device and method for effectively implementing an interleaver for a turbo encoder. In addition, the present invention provides a technique for removing a puncturing-caused delay.

2. Description of the Related Art

The transmitters/receivers in digital communication systems include channel encoders and decoders. The most widely used channel encoders are convolutional encoders and turbo encoders. The turbo encoder has an internal interleaver that changes the order of data output from a memory relative to the original order of the memory data input by generating random read addresses.

In general, when puncturing a signal and outputting the next valid signal in the course of successive signal outputting, the puncturing causes an output delay, that is, non-successive output of valid signals before and after the puncturing. FIG. 1 is a block diagram of a conventional interleaver 10. In FIG. 1, reference numeral 11 denotes an address generator for generating addresses to change the sequence of input data when it is output. The address generator 11 generates (K–S) invalid addresses if the size S of the input data is less than the size K of a two-dimensional matrix. Reference numeral 12 denotes a puncturer for puncturing the invalid addresses.

FIG. 2 illustrates a puncturing-caused output delay in the conventional interleaver 10. Reference numeral 21 denotes an example of an output signal of the address generator 11 shown in FIG. 1. Marked portions 21A and 21B indicate the positions of the invalid addresses. The puncturer 12 receives the addresses in the signal 21 and outputs a signal 22 shown in FIG. 2, puncturing the marked invalid addresses. As seen from the signal 22, the address signal is non-continuous due to the puncturing and the address after the puncturing is delayed.

This conventional technology is applied mainly to channel encoders and channel decoders in UMTS (Universal Mobile Telecommunication System) and requires additional complex operations to process a delay.

FIG. 3 is a block diagram of a turbo encoder 35 for use as a channel encoder in the UMTS system. Transmission data is fed to a first component encoder 31 and an interleaver 32 through an input port 30 in the turbo encoder 35. The first component encoder 31 encodes the input data and outputs a first parity bit P1. The interleaver 32 changes the order of output data from the original order of the input data. A second component encoder 33 encodes the interleaved data and outputs a second parity bit P2. In the meantime, the input data is simply output as a systematic bit X. Thus, the turbo encoder 35 outputs the systematic bit X, the first parity bit P1, and the second parity bit P2 for the input transmission data.

A controller (not shown) in the UMTS system determines the size of the input data ranging from 40 to 5112 bits and notifies the turbo encoder 35 of the number of input bits. Then, the turbo encoder 35 encodes the input data. The input data varies in length. The interleaver 32 includes a memory for sequentially storing the input data as it is received, and an address generator for generating read addresses according to a predetermined interleaving rule in order to output the input data in a different order. For example, a two-dimensional matrix of size K with 15 rows R and 16 columns C is 240 (K=RC), which is needed to store input data of size S of 237 bits. Therefore, the memory sequentially stores the 237-bit input data in the 240 storing areas of the matrix, leaving 3 bits of storage area unused. The address generator generates addresses according to the interleaving rule. If an interleaving index I, generated according to a predetermined interleaving rule, is greater than the input data size S (237), the address is neglected. If the generated index I is less than or equal to the input data size S (237), data stored at the address in the memory is output to the second component encoder 33. Having to neglect the addresses larger than data size S causes non-continuous data transmission to the second component encoder 33, and creates a time delay. The delay makes it difficult to estimate an accurate processing time in the interleaver 32 and additional control circuitry is required to reconstruct the non-continuous data into a continuous data stream.

Therefore, a need exists for effectively implementing an interleaver for a turbo encoder and to provide a technique for removing a puncturing-caused delay.

SUMMARY OF THE INVENTION

It is, therefore, an object of the present invention to provide an interleaver and a method for outputting interleaved data without a time delay.

It is another object of the present invention to provide a device and method for outputting signals without a puncturing-caused time output delay when puncturing is performed on successive output signals.

It is a further object of the present invention to provide an interleaver for providing successive data to a second component encoder in a turbo encoder.

It is a still further object of the present invention to provide a method for outputting stored data from a memory.

To achieve the foregoing and other objects, an apparatus and method are disclosed such that data of size S is stored in a memory of size K, with the memory of size K being a two-dimensional matrix with R rows and C columns, R×C, and interleaving indexes I are generated according to a predetermined interleaving rule to randomly output the data from the memory.

Disclosed is an apparatus for randomly outputting data stored sequentially in a memory, comprising a delay for receiving a first control signal at a first time period, outputting a second control signal at a second time period, and outputting a third control signal at a third time period; an index generator for receiving one of said first control signal and a fourth control signal and outputting an index upon receipt of said first or fourth control signal, said index representing a location in said memory; and a comparator for comparing said index to a reference parameter representative of the size of said data stored in said memory, and outputting upon receipt of said second control signal to said index generator said fourth control signal if said index is greater than said reference parameter. Also disclosed is an interleaver under control of a controller and having an address generator for outputting an address to a memory, said memory sequentially storing input data and outputting data stored at said address upon receipt of said address, said controller determining a data size of said input data, comprising a delay for receiving a primary index enable signal and outputting a comparator enable signal at a first time period, and outputting an address generator enable signal at a second time period; an index generator for receiving one of said primary index enable signal and a secondary index enable signal, and outputting an index upon receipt of said primary index enable signal or said secondary index enable signal; and a comparator for comparing upon receipt of said comparator enable signal said index and said data size and outputting said secondary index enable signal if said index is greater than said data size; wherein an input of said address generator is connected to the output of said index generator, and outputs upon receipt of said address generator enable signal a memory address associated with a most recently generated index.

Additionally disclosed is a method of outputting stored data from a memory, comprising the steps of sequentially storing input data into said memory; determining the size of the stored input data; receiving a first control signal and generating a first index; comparing said first index to said data size and generating a second index if said first index is greater than said data size; generating a second control signal; outputting a memory address associated with said first index if said second index is not generated; and outputting a memory address associated with said second index if said second index is generated.

Generally, if a first index I is greater than data size S, a second index is generated and output prior to outputting invalid data stored in the memory at the location of the first index. Here, puncturing is defined as outputting the next interleaving index without outputting an index greater than the data size. This is similar to the concept of pruning as utilized in the 3GPP (Third Generation Partnership Project).

BRIEF DESCRIPTION OF THE DRAWINGS

The above and other objects, features and advantages of the present invention will become more apparent from the following detailed description when taken in conjunction with the accompanying drawings in which:

FIG. 1 illustrates a typical interleaver;

FIG. 2 illustrates output signals having puncturing-caused time output delay as output from the typical interleaver of FIG. 1;

FIG. 3 illustrates a typical turbo encoder;

FIG. 4 illustrates an interleaver according to an embodiment of the present invention;

FIG. 5 is an operational timing diagram of the interleaver according to an embodiment of the present invention.

DETAILED DESCRIPTION OF THE PREFERRED EMBODIMENT

Figure 6:
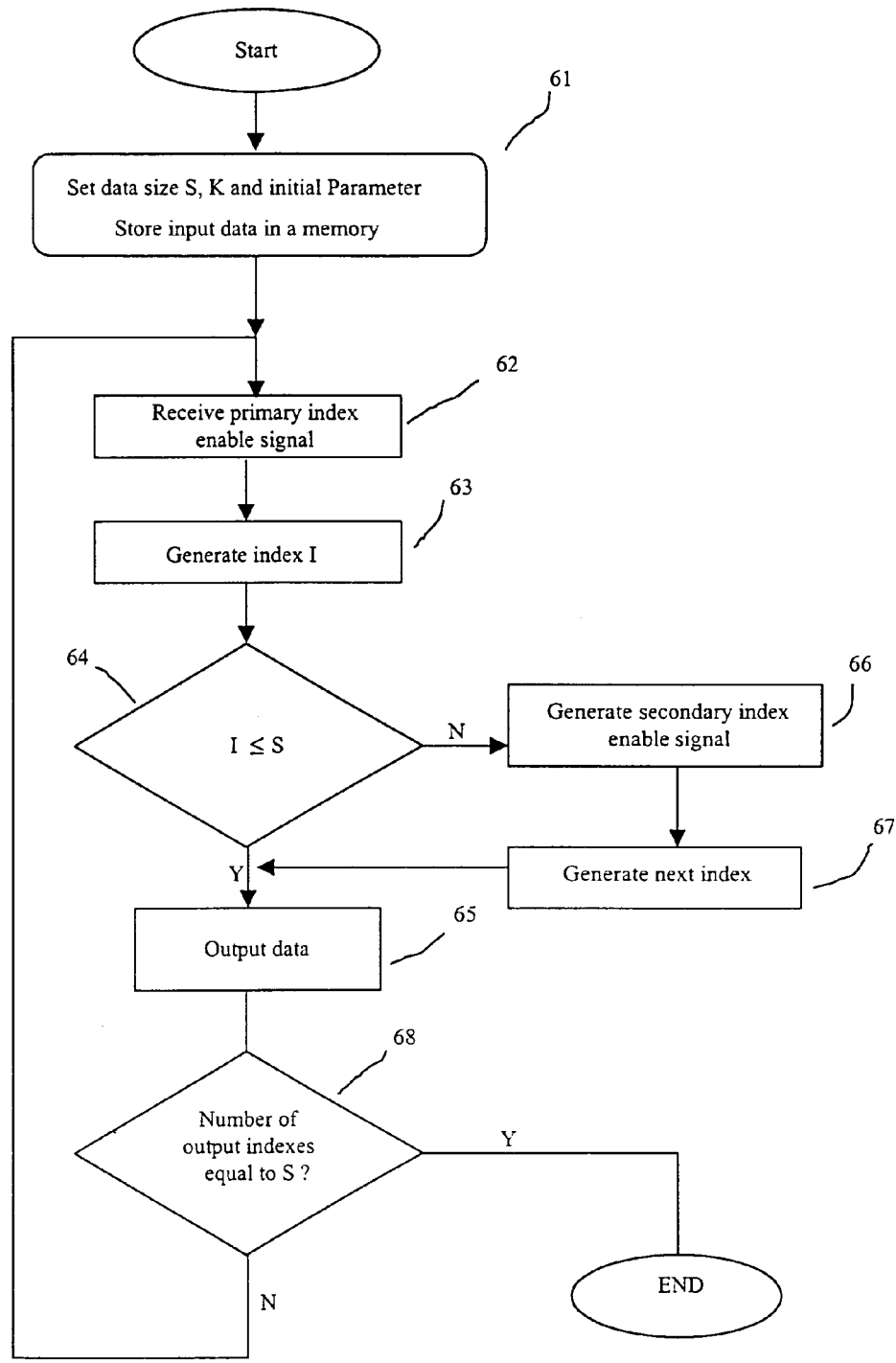
FIG. 6 is a flowchart illustrating the operation of the interleaver according to an embodiment of the present invention.

A preferred embodiment of the present invention will be described herein below with reference to the accompanying drawings. In the following description, well-known functions or constructions are not described in detail since they would obscure the invention in unnecessary detail.

Referring now to the drawings, in which like reference numerals identify similar or identical elements throughout the figures, an interleaver according to an embodiment of the present invention will be described with reference to FIG. 4. Interleaver 40 sequentially stores input data in a memory 45 under the control of a turbo encoder controller (not shown). A primary index enable signal IN_EA1 is periodically generated by the turbo encoder controller at each time T. The primary index enable signal IN_EA1 is applied to the input of an index generator 43 and a delay 41, for use in generating address indexes. Delay 41 delays the primary index enable signal IN_EA1 by a time T1 shorter than the period for generating the primary index enable signal IN_EA1 (i.e., T1<T). Delay 41 outputs a first delayed signal as a comparator enable signal COMP_EA. That is, the comparator enable signal COMP_EA is generated before a second primary index enable signal IN_EA1 is generated.

The index generator 43 stores information relating to the size K of the two-dimensional matrix and initial parameters needed for generating a pseudo random number. Upon receipt of the primary index enable signal IN_EA1, the index generator 43 outputs an index I (I=0, . . . , K-1) less than or equal to K using the given initial parameters according to a predefined rule, for example, as defined in the UMTS standard. Index I is input into a comparator 42 and an address generator 44. The comparator 42 compares index I with the input data size S. If index I is greater than the input data size S, the comparator 42 outputs a secondary index enable signal IN_EA2. The secondary index enable signal IN_EA2 is input into the index generator 43 and causes the index generator 43 to generate another index I. The index generator 43 generates an index I upon receipt of either the primary or secondary index enable signal.

Delay 41 also generates an address enable signal ADD_EA by delaying the primary index enable signal IN_EA1 for a time T2. Time T2 is longer than the time T1 of the comparator enable signal COMP_EA, but less than time T, the period of the primary index enable signal IN_EA1 (i.e., T1<T2<T). Delay 41 transmits the address enable signal ADD_EA to the address generator 44. When address generator 44 receives the address enable signal ADD_EA, the address generator 44 converts the index I received from the index generator 43 to a read address for the memory 45. Memory 45 then outputs the data stored in that address. Index I at the input of the address generator 44, at the time the address enable signal ADD_EA is received, is either that index generated by the primary index enable signal IN_EA1 or the next index I generated by the secondary index enable signal IN_EA2, if so generated by comparator 42. If the index I generated at the primary index enable time is less than the input data size S, the index I is converted to a read address by address generator 44. If the generated index is greater than the two-dimensional matrix size K, the next index, generated in response to the secondary index enable signal IN_EA2 output from the comparator 42, is converted to a read address by address generator 44. Since the comparator enable signal COMP_EA and the address enable signal ADD_EA are generated before the next primary index enable signal IN_EA1, read addresses are successively generated without time delay.

As is known in digital processing, data is preferably processed on a multiple of a byte (8 bits) basis because the processor, or controller, is designed to process data on the multiple of a byte basis. Data is stored in 8 bits or a multiple of 8 bits at the address designated by the read address in the memory. The four LSBs (Least Significant Bits) of the address represent a row in the (15×16) two-dimensional matrix and its four MSBs (Most Significant Bits) represent a column in the matrix. The controller reads 16 bits in the row designated by the 4-bit LSB and outputs a bit corresponding to the column designated by the 4-bit MSB to the second component encoder. Then, a second component encoder receives successive bits from the interleaver and generates second parity bits. The first component encoder outputs first parity bits by encoding sequential input data without interleaving. The delay requires extensive retiming of the data stream to maintain correlation between the data processed by the encoders. However, since the interleaver according to an embodiment of the present invention produces output data without any puncturing-caused delay, there is no need to consider and compensate for puncturing-caused time output delay to match the data output from the first and the second component encoders.

FIG. 5 is an operational timing diagram of the interleaver shown in FIG. 4. In FIG. 5, signal 51 indicates the primary index enable signal IN_EA1. The primary index enable signal IN_EA1 is generated at every time period T. Signal 51 shows eight primary index enable signals IN_EA1 51a–51h being generated. Signal 52 shows both the primary index enable signal IN_EA1 and the secondary index enable signal IN_EA2. Two secondary index enable signals IN_EA2 52a and 52b are shown. The combination of primary and secondary index enable signals IN_EA1 and IN_EA2 shown on signal line 52 are the inputs to index generator 43. Signal 53 indicates indexes generated from the index generator 43, and, in this example, consist of ten indexes 53A–53J. As seen from signal 53, new indexes are output in response to each of the primary and secondary index enable signals IN_EA1 and IN_EA2. Signal 54 indicates the comparator enable signal COMP_EA, and consists of eight generated signals 54a–54h. The comparator enable signal COMP_EA is produced by delaying the primary index enable signal IN_EA1 by the first time period T1, where T1 is less than T (i.e., T1<T). Signal 55 indicates the address enable signal ADD_EA, and also consists of eight signals 55a–55h. The address enable signal ADD_EA is produced by delaying the primary enable signal IN_EA1 by a second time period T2, where T2 is greater than T1 but less than T (i.e., T1<T2<T). Signal 56 indicates an address signal output from the address generator 44. As shown in FIG. 5, eight address signals 56A', 56B', 56C', 56E', 56F', 56H', 56I', and 56J', are produced as outputs of address generator 44.

A description of the operation of the interleaver according to an embodiment of the present invention will now be described with respect to FIGS. 4 and 5. Memory size K and initial interleaver parameters are stored in a memory of the turbo encoder. Input data is received into memory 45, and the data size S is determined and stored in the turbo encoder memory. A first index 53A is output by index generator 43 upon receipt of a first primary index enable signal IN_EA1 51a. A first comparator enable signal COMP_EA 54a is generated by delaying the first primary index enable signal IN_EA1 51a in delay 41 for a first time period equal to T1. Comparator 42 compares the first index 53A with the input data size S. Since, in this example, index 53A is less than S, a secondary index enable signal IN_EA2 is not generated. After the first primary index enable signal IN_EA1 51a is delayed by the second time period T2, delay 41 outputs a first address enable signal ADD_EA 55a, that is received by address generator 44, which in turn outputs an address 56A'. Address generator 44 supplies address 56A' to memory 45 causing memory 45 to output data stored at address location 56A'. The data output is forwarded to the second component encoder 33 for encoding.

A second index 53B is output by index generator 43 upon receipt of a second primary index enable signal IN_EA1 51b. A second comparator enable signal COMP_EA 54b is generated by delaying the second primary index enable signal IN_EA1 51b in delay 41 for the first time period T1. Comparator 42 compares the second index 53B with the input data size S. Since again, in this example, index 53B is less than S, a secondary index enable signal IN_EA2 is not generated. After the second primary index enable signal IN_EA1 51b is delayed by the second time period T2, delay 41 outputs a second address enable signal ADD_EA 55b, that is received by address generator 44, which in turn outputs an address 56B'. Address generator 44 supplies address 56B' to memory 45 causing memory 45 to output data stored at address location 56B'. The data output is forwarded to the second component encoder 33 for encoding.

A third index 53C is output by index generator 43 upon receipt of a third primary index enable signal IN_EA1 51c. A third comparator enable signal COMP_EA 54c is generated by delaying the third primary index enable signal IN_EA1 51c in delay 41 for the first time period T1. Comparator 42 compares the third index 53C with the input data size S. Since again, in this example, index 53C is less than S, a secondary index enable signal IN_EA2 is not generated. After the third primary index enable signal IN_EA1 51c is delayed by the third time period T2, delay 41 outputs a third address enable signal ADD_EA 55c, that is received by address generator 44, which in turn outputs an address 56C'. Address generator 44 supplies address 56C' to memory 45 causing memory 45 to output data stored at address location 56C'. The data output is forwarded to the third component encoder 33 for encoding.

When a fourth primary index enable signal IN_EA1 51d is supplied to interleaver 40, index generator 43 outputs a fourth index 53D. A fourth comparator enable signal COMP_EA 54d is generated after the fourth primary index signal IN_EA1 51d is delayed by the first time period T1. Comparator 42 compares the fourth index 53D with data size S. In this example, the index 53D is greater than data size S, and therefore, comparator 42 generates a secondary index enable signal IN_EA2 52a. In response to the secondary index enable signal IN_EA2 52a, index generator 43 generates a fifth index 53E upon receipt of the secondary index enable signal IN_EA2 52a. After the fourth primary index enable signal IN_EA1 51d is delayed by the second time period T2, delay 41 outputs a fourth address enable signal ADD_EA 55d, and address generator 44 outputs an address 56E' in accordance with the fourth address enable signal ADD_EA 55d. As address generator 44 did not receive an address enable signal ADD_EA when fourth index 53D was at its input, address generator 44 did not process the fourth index 53D. It was only when the fourth address enable signal ADD_EA 55d was received at address generator 44 that address generator 44 outputs a valid address 56E' based on the fifth index 53E being present at the input of address generator 44 when the fourth address enable signal ADD_EA 55d is received. In this manner, the invalid index of 53D is ignored as it represents a memory address greater than the data size S, and a next index 53E is generated by index generator 43 before address generator 44 acts upon the invalid address. Address generator 44 supplies address 56E' to memory 45 causing memory 45 to output data stored at address location 56E'. The data output is forwarded to the third component encoder 33 for encoding.

A sixth index 53F is output by index generator 43 upon receipt of a fifth primary index enable signal IN_EA1 51e. A fifth comparator enable signal COMP_EA 54e is generated by delaying the fifth primary index enable signal IN_EA1 51e in delay 41 for the first time period T1. Comparator 42 compares the sixth index 53F with the input data size S. Since again, in this example, index 53F is less than data size S, a secondary index enable signal IN_EA2 is not generated. After the fifth primary index enable signal IN_EA1 51e is delayed by the fifth time period T2, delay 41 outputs a fifth address enable signal ADD_EA 55e, that is received by address generator 44, which in turn outputs an address 56F'. Address generator 44 supplies address 56F' to memory 45 causing memory 45 to output data stored at address location 56F'. The data output is forwarded to the fifth component encoder 33 for encoding.

When a sixth primary index enable signal IN_EA1 51f is supplied to interleaver 40, index generator 43 outputs a seventh index 53G. A sixth comparator enable signal COMP_EA 54f is generated after the sixth primary index signal IN_EA1 51f is delayed by the first time period T1. Comparator 42 compares the seventh index 53G with data size S. In this example, the index of 53G is again greater than data size S, and therefore, comparator 42 generates a secondary index enable signal IN_EA2 52b. In response to the secondary index enable signal IN_EA2 52b, index generator 43 generates a eighth index 53H upon receipt of the secondary index enable signal IN_EA2 52b. After the sixth primary index enable signal IN_EA1 51f is delayed by the second time period T2, delay 41 outputs a sixth address enable signal ADD_EA 55f, and address generator 44 outputs an address 56H' in accordance with the sixth address enable signal ADD_EA 55f. As address generator 44 did not receive an address enable signal ADD_EA when seventh index 53G was at its input, address generator 44 did not process the seventh index 53G. It was only when the sixth address enable signal ADD_EA 55f was received at address generator 44 that address generator 44 outputs a valid address 56H' based on the eighth index 53H being present at the input of address generator 44 when the sixth address enable signal ADD_EA 55f is received. In this manner, the invalid index of 53G is ignored as it represents a memory address greater than the data size S, and a next index 53H is generated by index generator 43 before address generator 44 acts upon the invalid address. Address generator 44 supplies address 56H' to memory 45 causing memory 45 to output data stored at address location 56H'. The data output is forwarded to the third component encoder 33 for encoding.

The process continues in a manner similar to the processing of index 53A for processing indexes 53I and 53J, resulting in the generation of addresses 56I' and 56J' by address generator 44. This completes one cycle of eight primary index enable signals. In the earlier example where data size S equals 237, this process would continue until all of the 237 valid addresses are generated.

As described above, if a generated index I is greater than data size S, the secondary index enable signal IN_EA2 is generated immediately after the comparator 42 is enabled, and a next index is generated by index generator 43. Then, the address enable signal ADD_EA is generated to thereby generate an address without a time delay. According to the interleaving rule of the UMTS system, no values greater than S are successively generated for input data of any size, and therefore, there is no need for comparing an index generated by the secondary enable signal IN_EA2 with data size S.

In the above description, an index is used as a medium to generate an address. Alternatively, the index itself can be output as an address. In this case, the index generator 43 functions as an address generator that selectively outputs an address in response to the address enable signal ADD_EA.

FIG. 6 is a flowchart illustrate operation of the interleaver 40 according to an embodiment of the present invention. Referring to FIG. 6, stored in the turbo encoder are the two-dimensional matrix values, R, C and K, and an initial parameter for interleaving. In step 61, the turbo encoder stores input data sequentially into the memory and determines data size S. In step 62, a first primary index enable signal IN_EA1 is received by the delay 41 and the index generator 43. In step 63, index generator 43 generates a first index. In step 64, index I is compared with data size S to determine if I is less than or equal to S. If it is determined that index I is less than or equal to data size S, in step 65 data associated with the first index is output. But, if in step 64 it is determined that index I is greater than data size S, the index generator 43 of interleaver 40, generates a secondary index enable signal in step 66. Then, in step 67, index generator 43 generates a second index. The second index is sent to address generator 44 to output, in step 65, data associated with the second index. Then in step 68 the turbo encoder controller determines if the number of output indexes is equal to data size S. If the number of output indexes is not equal to data size S, the process returns to step 62 to await a second primary index enable signal. But, if the number of output indexes is equal to data size S, the process ends to await the next block of data, if any.

Therefore, the inventive device and method enables successive data output without puncturing-caused time delay. While the invention has been shown and described with reference to a certain preferred embodiments thereof, it will be understood by those skilled in the art that various changes in form and details may be made therein without departing from the spirit and scope of the invention as defined by the appended claims.

What is claimed is:

1. A method of outputting stored data from a memory, comprising the steps of:
   sequentially storing input data into said memory;
   determining the size of the stored input data;
   receiving a first control signal and generating a first index;
   comparing said first index to said data size and generating a second index if said first index is greater than said data size;
   outputting a memory address associated with said first index if said second index is not generated; and
   outputting a memory address associated with said second index if said second index is generated.

* * * * *